United States Patent
Sihombing et al.

(10) Patent No.: US 9,070,763 B1
(45) Date of Patent: Jun. 30, 2015

(54) SEMICONDUCTOR DEVICE LAYOUT STRUCTURE

(71) Applicant: Vanguard International Semiconductor Corporation, Hsinchu (TW)

(72) Inventors: Rudy Octavius Sihombing, Medan (ID); Shang-Hui Tu, Jhubei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/225,932

(22) Filed: Mar. 26, 2014

(51) Int. Cl.
*H01L 27/10* (2006.01)
*H01L 29/78* (2006.01)

(52) U.S. Cl.
CPC ........ *H01L 29/7802* (2013.01); *H01L 29/7813* (2013.01)

(58) Field of Classification Search
CPC ............ H01L 29/7802; H01L 29/7803; H01L 29/7809; H01L 29/7813; H01L 21/826487; H01L 21/823885

USPC ........... 438/129, 243, 599; 257/202, 204, 206
See application file for complete search history.

(56) References Cited

U.S. PATENT DOCUMENTS

| | | | |
|---|---|---|---|
| 8,889,511 B2 * | 11/2014 | Yedinak et al. | 438/270 |
| 8,890,280 B2 * | 11/2014 | Luo et al. | 257/488 |
| 8,928,077 B2 * | 1/2015 | Lee et al. | 257/339 |
| 2014/0252456 A1 * | 9/2014 | Liao | 257/329 |
| 2015/0035051 A1 * | 2/2015 | Hebert | 257/334 |

* cited by examiner

*Primary Examiner* — Kevin M Picardat
(74) *Attorney, Agent, or Firm* — Birch, Stewart, Kolasch & Birch, LLP

(57) ABSTRACT

A semiconductor device layout structure is provided. The semiconductor device layout structure includes an active region having a first conductivity type over a semiconductor substrate. The active region is provided with semiconductor devices formed thereon. A first super junction layout unit in the active region includes a first trench. A first doped region having a first conductivity type is formed surrounding the first trench. A second trench is formed surrounding the first doped region. A second doped region having a second conductivity type is formed surrounding the second trench. The first trench is laterally separated from the second trench through the first doped region and the second doped region in a plan view.

40 Claims, 9 Drawing Sheets

SEMICONDUCTOR DEVICE LAYOUT STRUCTURE

BACKGROUND OF THE INVENTION

1. Field of the Invention

The present invention relates to a semiconductor device layout structure, and in particular to a vertical diffusion super junction device layout structure.

2. Description of the Related Art

The conventional vertical diffusion metal-oxide-semiconductor field effect transistor (VDMOSFET) has a p-n junction structure composed of an n-type drift doped region and an overlying p-type base doped region. The p-n junction structure is mainly used to withstand a voltage applied to the conventional VDMOSFET. When improving an operation voltage of the VDMOSFET, a reduced dopant concentration and an increased thickness of the n-type drift doped region is required. The ways to improve a withstand voltage of the p-n junction structure results in an increased on-resistance (Ron) for the conventional VDMOSFET. Ron of the conventional VDMOSFET is limited by the dopant concentration and the thickness of the n-type drift doped region. A VDMOSFET having a super junction structure has been developed to improve the dopant concentration of the n-type drift doped region, so that Ron of the VDMOSFET can be improved.

The conventional super junction structure is usually fabricated by a multi-epitaxy technology (COOLMOS™). The multi-epitaxy technology requires performing several process cycles of an epitaxy growing process, a p-type dopant implantation process and a thermal diffusion process. Therefore, the multi-epitaxy technology has the drawbacks of having plenty of processing steps, and a high fabrication cost. Also, the dimensions of the VDMOSFET are hard to reduce.

Thus, a semiconductor device layout structure having a super junction structure is desired.

BRIEF SUMMARY OF THE INVENTION

An exemplary embodiment of a semiconductor device layout structure is provided. The semiconductor device layout structure includes an active region having a first conductivity type over a semiconductor substrate. The active region is provided with semiconductor devices formed thereon. A first super junction layout unit in the active region includes a first trench. A first doped region having a first conductivity type is formed surrounding the first trench. A second trench is formed surrounding the first doped region. A second doped region having a second conductivity type is formed surrounding the second trench. The first trench is laterally separated from the second trench through the first doped region and the second doped region in a plan view.

Another exemplary embodiment of a semiconductor device layout structure includes an active region having a first conductivity type over a semiconductor substrate. The active region is provided with semiconductor devices formed thereon. A super junction layout unit in the active region includes a first trench has a first sidewall and a second sidewall adjacent to the first sidewall. A first doped region having a first conductivity type is formed surrounding the first trench. A second trench is close to the first sidewall of the first trench. A second doped region having a second conductivity type is formed surrounding the second trench. The first trench is laterally separated from the second trench through the first doped region and the second doped region in a plan view. A third trench is close to the second sidewall of the first trench. A third doped region having the second conductivity type is formed surrounding the second trench. The first trench is laterally separated from the third trench through the first doped region and the third doped region in a plan view.

Yet another exemplary embodiment of a semiconductor device layout structure includes an active region having a first conductivity type over a semiconductor substrate. The active region is provided with semiconductor devices formed thereon. A super junction layout unit in the active region includes a first trench; a first doped region having a first conductivity type is formed surrounding the first trench. A second trench is close to the first trench. A second doped region having a second conductivity type is formed surrounding the second trench. The first trench is laterally separated from the second trench through the first doped region and the second doped region in a plan view. A first sidewall of the first trench and a second sidewall of the second trench close to the first sidewall are parallel to each other.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
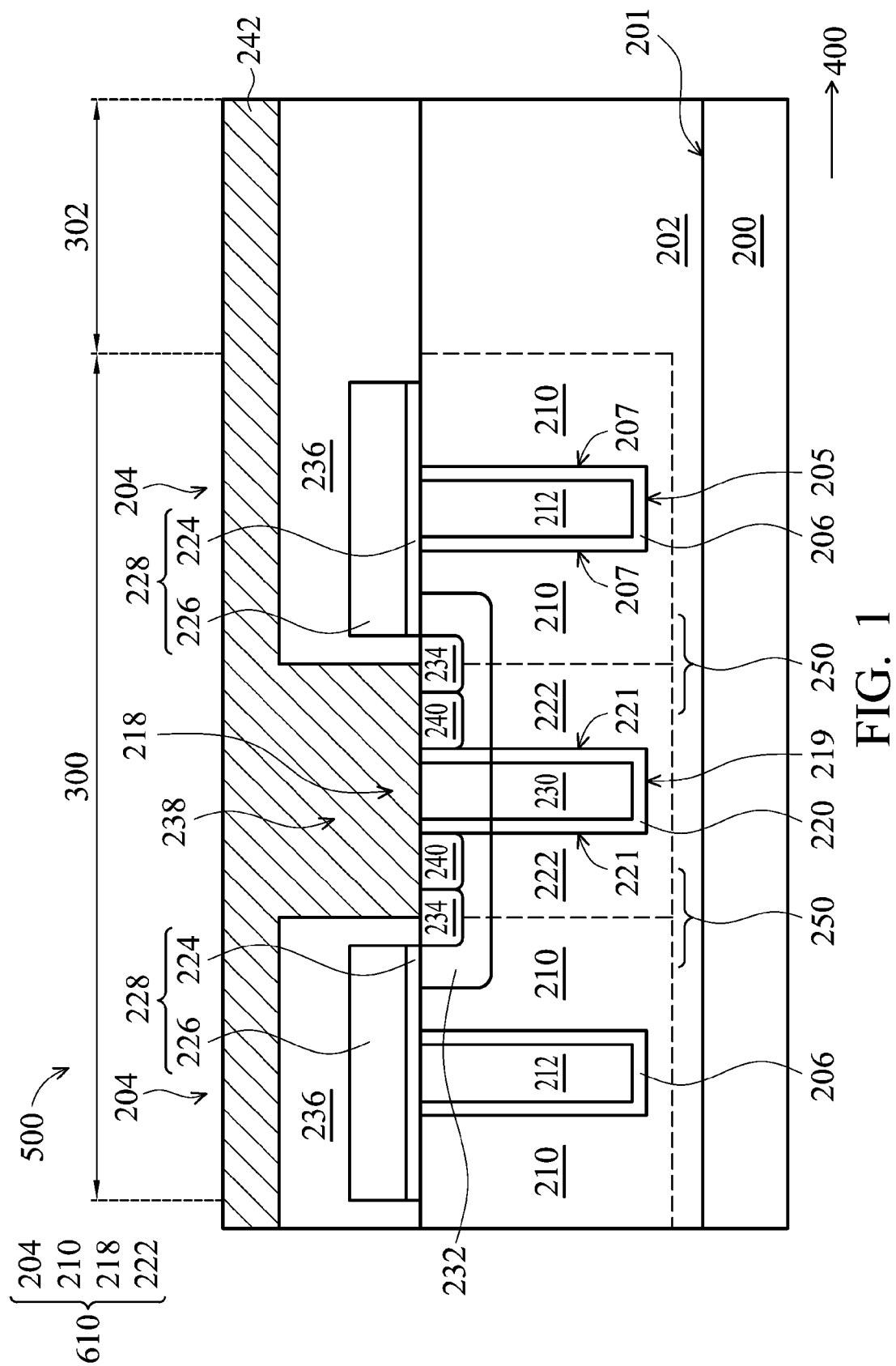
FIG. 1 is cross-sectional view of a semiconductor device in accordance with some embodiments of the invention.

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice the invention.

Embodiments of a semiconductor device layout structure are provided. The semiconductor device layout structure includes a layout for a metal-oxide-semiconductor field effect transistor (MOSFET) having super junction structures, for example, a super junction vertical diffusion MOSFET (super junction VDMOSFET).

FIG. 1 is cross-sectional view of a semiconductor device 500 in accordance with some embodiments of the invention.

In some embodiments, the semiconductor device 500 comprises a metal-oxide-semiconductor field effect transistor (MOSFET) having super junction structures, for example, a super junction vertical diffusion MOSFET (super junction VDMOSFET). As shown in FIG. 1, the semiconductor device 500 comprises a semiconductor substrate 200 having a first conductive type in accordance with some embodiments. An epitaxy layer 202 having the first conductive type is formed on the semiconductor substrate 200. In some embodiments, the epitaxy layer 202 may comprise an active region 300 and a termination region 302 surrounding the active region 300. In one embodiment, the active region 300 may be provided with semiconductor devices formed thereon, and the termination region 302 is used as an isolation feature between the semiconductor devices. A first trench 204 is formed in the epitaxy layer 202. A first insulating liner layer 206 is conformably formed on a sidewall 207 and a bottom 205 of the first trench 204. A first doped region 210 is formed from the sidewall 207 and the bottom 205 of the first trench 204 to a portion of the epitaxy layer 202. The first doped region 210 is formed surrounding the first trench 204. In some embodiments, the first doped region 210 has the first conductive type. A first insulating material 212 is filled into the first trench 204. A second trench 218 is formed in the epitaxy layer 202. A second insulating liner layer 220 is conformably formed on a sidewall 221 and a bottom 219 of the second trench 218. A second insulating material 230 is filled into the second trench 218. A second doped region 222 is formed from the sidewall 221 and the bottom 219 of the second trench 218 to a portion of the epitaxy layer 202. The second doped region 222 is formed surrounding the second trench 218. In some embodiments, the first doped region 210 has a second conductive type different from the first conductive type. In some embodiments, the first doped region 210 is adjacent to the second doped regions 222 along a first direction 400 as shown in FIG. 1. In some embodiments, the first conductive type is N-type, and the second conductive type is P-type. Accordingly, a super junction structure 250 is formed having the first doped regions 210 surrounding the first trench 204 and the second doped regions 222 surrounding the second trench 218. The first doped region 210 and the second doped region 222 of the super junction structure 250 are adjacent to each other. Therefore, a PN junction is formed on the interface between the first doped region 210 and the second doped region 222 adjacent thereto of the super junction structure 250. In some embodiments, the first trench 204 for forming the N-type first doped region 210 may serve as an N-type trench 204. Also, the second trench 218 for forming the P-type second doped region 222 may serve as a P-type trench 218. In some embodiments, the N-type trench 204, the P-type trench 218, the N-type first doped regions 210 surrounding the N-type trench 204 and the P-type second doped regions 222 surrounding the P-type trench 218 adjacent thereto are composed of a super junction layout unit 610.

As shown in FIG. 1, the semiconductor device 500 further comprises a gate structure 228 including a gate oxide layer 224 and a gate layer 226 on the gate oxide layer 224 in accordance with some embodiments. The gate structure 228 covers the first trench 204 and a portion of the epitaxy layer 202, which is adjacent to the first trench 204. The second trench 218 is exposed from the gate structure 228. A first well 232 having the second conductive type is formed in the epitaxy layer 232 without being covered by the gate structure 228. A source region 234 having the first conductive type is formed in the first well 232. The source region 234 is adjacent to gate structure 228. In some embodiments, an interlayer dielectric layer 236 is formed covering the epitaxy layer 202 and the gate structure 228. A contact hole 238 is formed through the interlayer dielectric layer 236. The second trench 218 and the portion of the epitaxy layer 202, which is adjacent to the second trench 218, are exposed from the contact hole 238. A pick-up doped region 240 having the second conductive type is formed in the portion of the epitaxy layer 202 exposed from the contact hole 238. A contact plug 242 is filled into the contact hole 238.

Figure 2A:
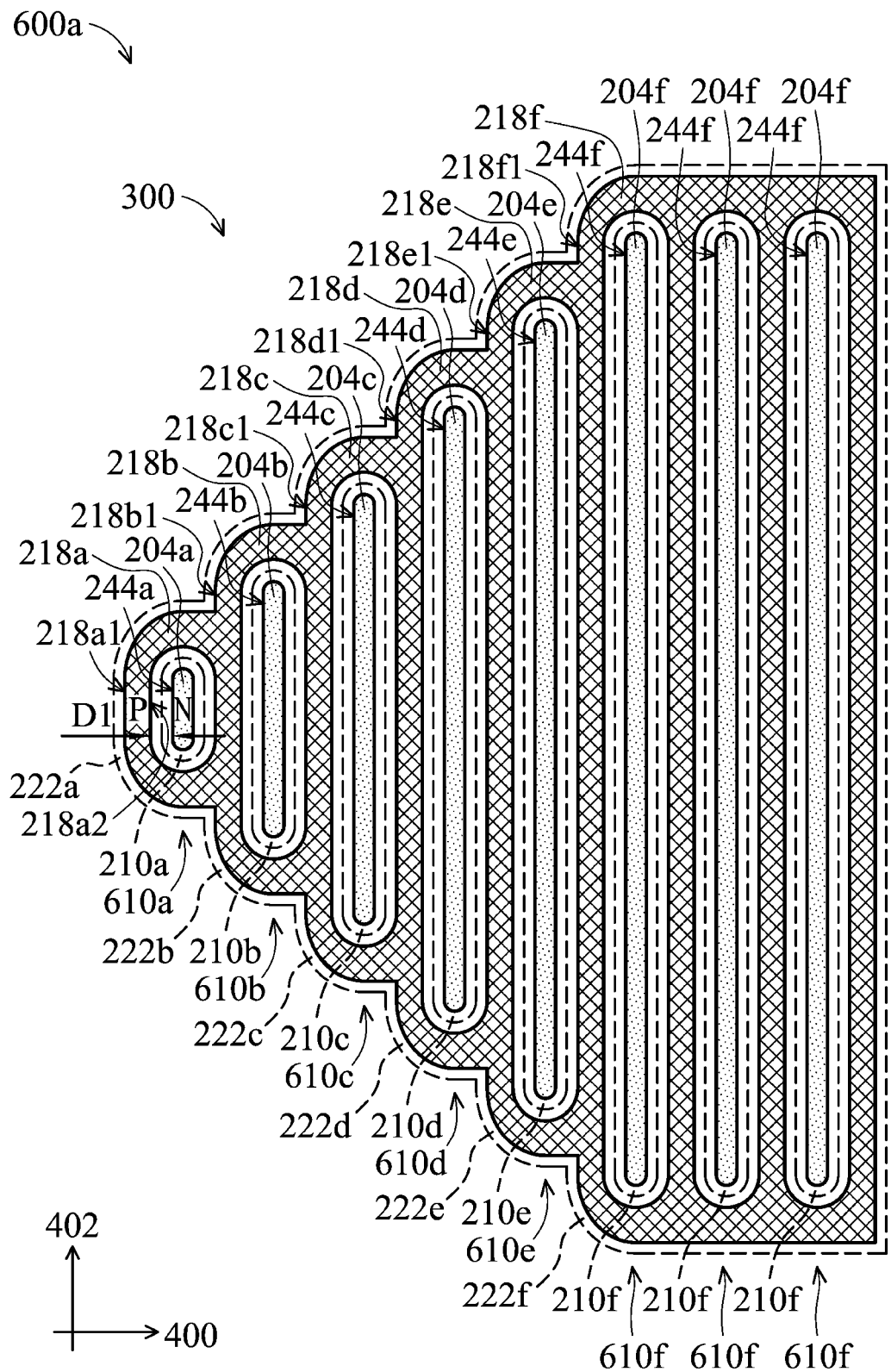
FIGS. 2A-2B are plan views showing semiconductor device layout structures of N-type trenches and P-type trenches in accordance with some embodiments of the invention.
Figure 2B:
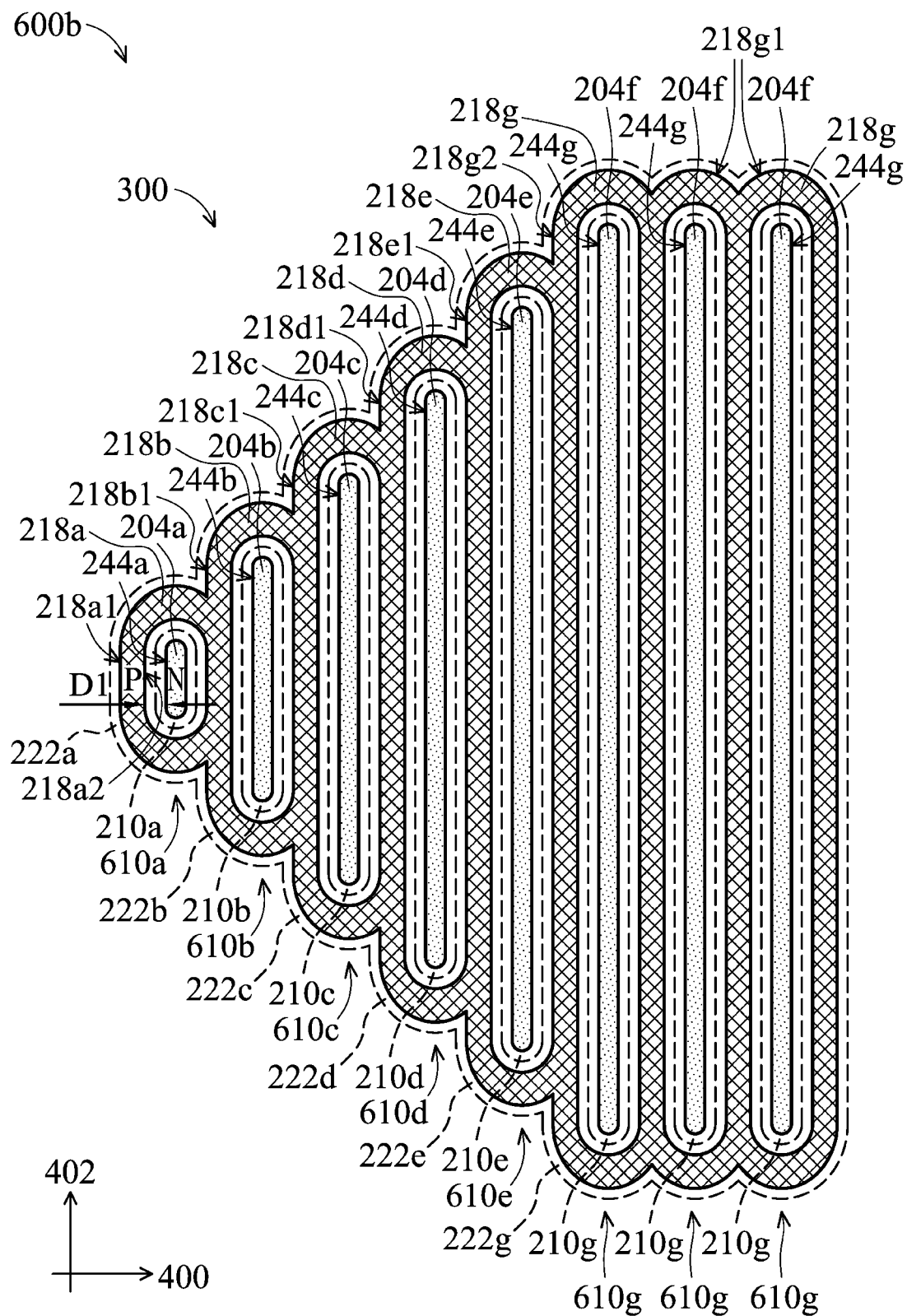

FIGS. 2A-2B are plan views showing semiconductor device layout structures 600a-600b of N-type trenches and P-type trenches in accordance with some embodiments of the invention. In some embodiments, one or more than one super junction layout unit, which includes an N-type trench and a P-type trench, an N-type first doped region surrounding the N-type trench and the P-type second doped region surrounding the P-type trench adjacent thereto, is arranged in the active region 300. As shown in FIG. 2A, the semiconductor device layout structure 600a includes super junction layout units 610a-610f arranged side-by-side, along a direction 400. The super junction layout unit 610a includes a first trench 204a. A first doped region 210a having a first conductivity type is formed surrounding the first trench 204a. A second trench 218a is formed surrounding the first doped region 204a. A second doped region 222a having a second conductivity type is formed surrounding the second trench 218a. In some embodiments, the first trench 204a is laterally (along the direction 400) separated from the second trench 218a through the first doped region 210a and the second doped region 222a in a plan view as shown in FIG. 2A.

In some embodiments, the first conductive type is N-type, and the second conductive type is P-type. In some embodiments, the first trench 204a for forming the N-type first doped region 210a may serve as an N-type trench 204a of the super junction layout unit 610a. Also, the second trench 218a for forming the P-type second doped region 222a may serve as a P-type trench 218a of the super junction layout unit 610a.

In some embodiments, a plan view shape of the first trench 204a of the super junction layout unit 610a includes a strip-shape extended along a direction 402 as shown in FIG. 2A. A plan view shape of the second trench 218a includes a ring-shape extended along the direction 402. In some embodiments, the second trench 218a is arranged conformably surrounding a sidewall (boundary) of the first trench 204a. In the super junction layout unit 610a, the sidewall of the first trench 204a is parallel to the sidewall of the second trench 218a close thereto. Also, the second trench 218a is separated from the first trench 204a by a fixed distance D1.

The first doped region 210a of the super junction layout unit 610a is formed by performing a doping process to dope a first dopant having the first conductive type into a portion of the epitaxy layer 202 from the two opposite sidewalls 207 of the first trench 204 as shown in FIG. 1 in accordance with some embodiments. Therefore, the first doped region 210a of the super junction layout unit 610a is adjacent to the sidewall (boundary) of the first trench 204a as shown in FIG. 2A in accordance with some embodiments. Similarly, the second doped region 222a of the super junction layout unit 610a is formed by performing another doping process to dope a second dopant having a second conductive type, which is opposite to the first conductive type, into a portion of the epitaxy layer 202 from the two opposite sidewalls 221 of the second trench 218 to form a second doped region 222 as shown in FIG. 1 in accordance with some embodiments. Therefore, the second doped region 222a of the super junction layout unit 610a is adjacent to a sidewall of the second trench 218a as shown in FIG. 2A in accordance with some embodiments.

In some embodiments, the sidewall of the second trench 218a of the super junction layout unit 610a has an inner sidewall portion 218a2 close to the first trench 204a and an outer sidewall portion 218a1 away from the first trench 204a as shown in FIG. 2A. In some embodiments, the second doped region 222a adjacent to the inner sidewall portion 218a2 of the sidewall of the second trench 218a is adjacent to the first doped region 210a of the super junction layout unit 610a.

In some embodiments, the first trench 204a of the super junction layout unit 610a has a round-shaped terminal 244a as shown in FIG. 2A. Because the second trench 218a can be arranged conformably surrounding a sidewall (boundary) of the first trench 204a, therefore the outer sidewall portion 218a1 of the second trench 218a close to the round-shaped terminal 244a of the first trench 204a can be arranged in a round-shape.

In some embodiments, the semiconductor device layout structure 600a includes super junction layout units 610b-610f arranged side-by-side to the super junction layout unit 610a that have layout arrangements similar to the super junction layout unit 610a of the semiconductor device layout structure 600a as shown in FIG. 2A. For example, the super junction layout unit 610b/610c/610d/610e/610f includes a first trench 204b/204c/204d/204e/204f. A first doped region 210b/210c/210d/210e/210f having a first conductivity type, surrounds the first trench 204b/204c/204d/204e/204f. A second trench 218b/218c/218d/218e/218f surrounds the first doped region 204b/204c/204d/204e/204f. A second doped region 222b/222c/222d/222e/222f having a second conductivity type, surrounds the second trench 218b/218c/218d/218e/218f. In some embodiments, the first trench 204b/204c/204d/204e/204f is laterally (along the direction 400) separated from the second trench 218b/218c/218d/218e/218f through the first doped region 210b/210c/210d/210e/210f and the second doped region 222b/222c/222d/222e/222f in a plan view as shown in FIG. 2A.

In some embodiments, a plan view shape of the first trenches 204a-204f of the super junction layout units 610a-610f is a strip-shape extended along the direction 402 as shown in FIG. 2A. The first trenches 204a-204f of the super junction layout units 610a-610f are parallel to each other. In some embodiments, the outer sidewall portions 218b1-218e1 of the second trenches 218b-218e close to the round-shaped terminals 244b-244e of the first trenches 204b-244e are arranged in a round-shape, respectively.

In some embodiments, the super junction layout units 610a-610f are arranged side-by-side. The second trench 218b of the super junction layout unit 610b overlaps with the second trench 218a of the super junction layout unit 610a as shown in FIG. 2A. Similarly, the second trench 218c of the super junction layout unit 610c overlaps with the second trench 218b of the super junction layout unit 610b. The second trench 218d of the super junction layout unit 610d overlaps with the second trench 218c of the super junction layout unit 610c. The second trench 218e of the super junction layout unit 610e overlaps with the second trench 218d of the super junction layout unit 610d. The second trench 218f of the super junction layout unit 610f overlaps with the second trench 218e of the super junction layout unit 610e.

In some embodiments, one of the differences between the super junction layout units 610a-610f is that the first trench 204a-204f of super junction layout units 610a-610f have different lengths along the direction 402 as shown in FIG. 2A. For example, a length of the first trench 204b of the super junction layout unit 610b is longer than that of the first trench 204a of the super junction layout unit 610a. In some embodiments, the lengths of the first trench 204a-204f are gradually increased.

In some embodiments, the semiconductor device layout structure 600a includes three super junction layout units 610f arranged side-by-side, along the direction 400 as shown in FIG. 2A. Therefore, the first trenches 204f of the three super junction layout units 610f have a same length along the direction 402. The outer sidewall portions 218f2 of the second trenches 218f of the three super junction layout units 610f collectively have a rectangular shape.

FIG. 2B is a plan view showing semiconductor device layout structure 600b of N-type trenches and P-type trenches in accordance with some embodiments of the invention. In some embodiments, one of the differences between the super junction layout units 600a and 600b is that the super junction layout unit 600b shown in FIG. 2B includes three super junction layout units 610g instead of the three super junction layout units 610f as shown in FIG. 2A. In some embodiments, the outer sidewall portions 218g1 of the second trenches 218g close to the round-shaped terminals 244g of the first trenches 204f of the three super junction layout units 610g are arranged in a round-shape, respectively.

Figure 3:
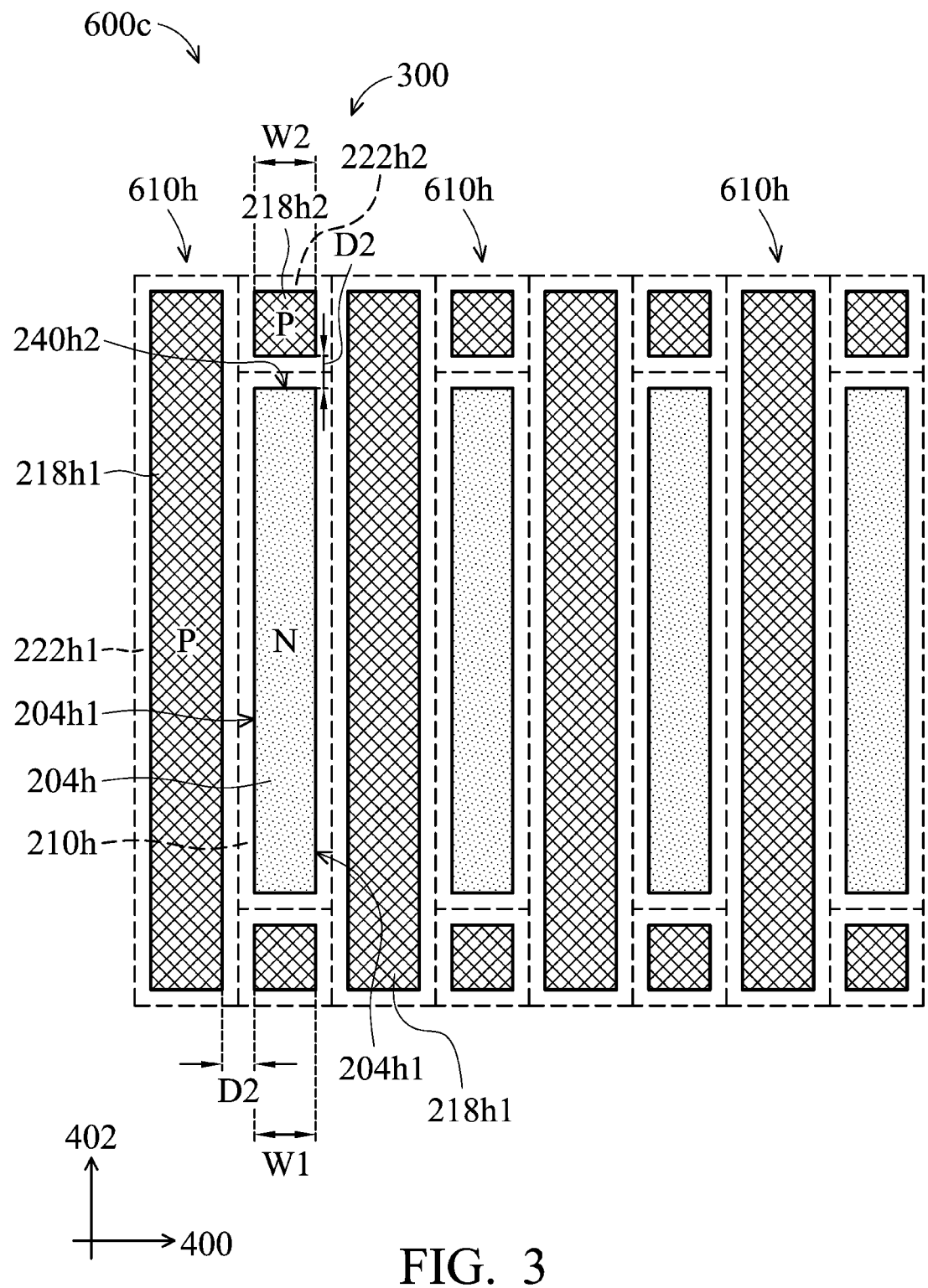
FIG. 3 is a plan view showing a semiconductor device layout structure of N-type trenches and P-type trenches layout structure in accordance with some embodiments of the invention.

FIG. 3 is a plan view showing a semiconductor device layout structure 600c of N-type trenches and P-type trenches arranged in the active region 300 in accordance with some embodiments of the invention. In some embodiments, a plurality of P-type trenches separated from each other can be substantially conformably formed along different sidewalls of each N-type trench. As shown in FIG. 3, the semiconductor device layout structure 600c includes a number of super junction layout units 610h arranged side-by-side, along the direction 400 in accordance with some embodiments. In some embodiments, the super junction layout unit 610h includes a first trench 204h. The first trench 204h has two opposite first sidewalls 204h1 and two opposite second sidewalls 204h2 adjacent to the first sidewalls 204h1. In some embodiments, the opposite first sidewalls 204h1 are substantially along the direction 402, and the two opposite second sidewalls 204h2 are substantially along the direction 400. A first doped region 210h having a first conductivity type is formed surrounding the first trench 204h. Two opposite second trenches 218h1 are close to the two opposite first sidewalls 204h1 of the first trench 204h, respectively. A second doped region 222h1 having a second conductivity type is formed surrounding each of the second trenches 218h1. In the super junction layout units 610h, the first trench 204h is laterally (along the direction 400) separated from the second trench 218h1 through the first doped region 210h and the second doped region 222h1 in a plan view as shown in FIG. 3. The super junction layout units 610h further includes two opposite third trenches 218h2 close to the two opposite second sidewalls 204h2 of the first trench 204h, respectively. A third doped region 222h2 having the second conductivity type is formed surrounding each of the third trenches 218h2. The first trench 204h is laterally (along the direction 402) separated from the third trench 218h2 through the first doped region 210h and the third doped region 222h2 in a plan view as shown in FIG. 3.

In some embodiments, the first conductive type is N-type, and the second conductive type is P-type. In some embodiments, the first trench 204h for forming the N-type first doped region 210h may serve as an N-type trench 204h of the super junction layout unit 610h. Also, the second trench 218h1 for forming the P-type second doped region 222h1 may serve as a P-type trench 218h1 of the super junction layout unit 610h. Furthermore, the third trench 218h2 for forming the P-type third doped region 222h2 may serve as a P-type trench 218h2 of the super junction layout unit 610h.

In some embodiments, the first doped region 210h is formed adjacent to the first sidewall 204h1 and the second sidewall 204h2 of the first trench 204h as shown in FIG. 3. As shown in FIG. 3, the second doped region 222h1 is formed adjacent to a sidewall of the second trench 218h1, and the third doped region 22h2 is formed adjacent to a sidewall of the third trench 218h2 in accordance with some embodiments.

In some embodiments, a plan view shape of the first trench 204h of the super junction layout unit 610h includes a strip-shape extended along the direction 402 as shown in FIG. 3. Also, a plan view shape of the second trench 218h1 includes a strip-shape extended along the direction 402. In the super junction layout unit 610h, the first sidewall 204h1 of the first trench 204h is parallel to a sidewall of the second trench 218h1 close thereto. In some embodiments, the second trench 218h1 is separated from the first trench 204h by a fixed distance D2 as shown in FIG. 3.

In some embodiments, a plan view shape of the third trench 218h2 includes a rectangular shape. In the super junction layout unit 610h, the second sidewall 204h2 of the first trench 204h is parallel to a sidewall of the third trench 218h2 close thereto. In some embodiments, the third trench 218h2 is separated from the first trench 204h by a fixed distance D2 as shown in FIG. 3.

In some embodiments, the third trench 218h2 is aligned with the second trench 218h1 along the direction 400 as shown in FIG. 3. A width W2 of the third trench 218h2 is equal to a width W1 of the first trench 204h along the direction 400. In some embodiments, one of the two opposite second trenches 218h1 of the super junction layout unit 610h overlaps with one of the two opposite second trenches 218h1 of another super junction layout unit 610h adjacent thereto as shown in FIG. 3. Also, the overlapping second trench 218h1 for the two adjacent super junction layout units 610h keeps a fixed distance D2 away from the two adjacent super junction layout units 610h.

Figure 4A:
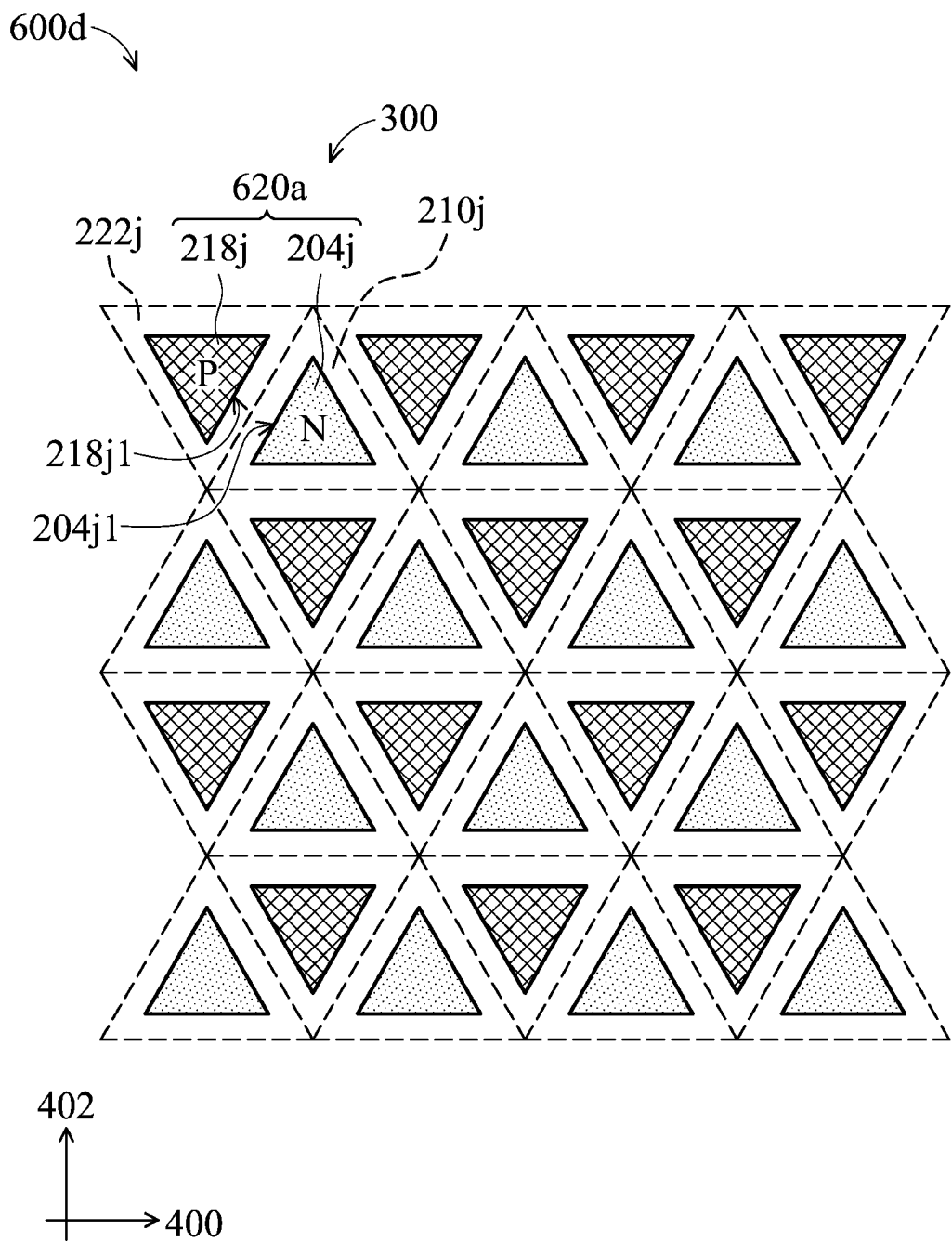
FIGS. 4A-4E are plan views showing semiconductor device layout structures of N-type trenches and P-type trenches in accordance with some embodiments of the invention, and the N-type trenches and P-type trenches arranged in a matrix.

FIGS. 4A-4E are plan views showing semiconductor device layout structures 600d-600h of N-type trenches and P-type trenches in accordance with some embodiments of the invention. In some embodiments, the N-type trenches and P-type trenches are alternatively arranged in a matrix. As shown in FIG. 4A, the semiconductor device layout structure 600d includes a number of super junction layout units 620a arranged in a matrix in accordance with some embodiments. Each of the super junction layout units 620a includes a first trench 204j and a second trench 218j is close to the first trench 204j. A first doped region 210j having a first conductivity type is formed surrounding the first trench 204j. A second doped region 222j having a second conductivity type is formed surrounding the second trench 218j. In the super junction layout unit 620a, the first trench 204j is laterally (along the direction 400) separated from the second trench 218j through the first doped region 210j and the second doped region 222j in a plan view as shown in FIG. 4A. In some embodiments, a first sidewall 204j1 of the first trench 204j and a second sidewall 218j1 of the second trench 218j close to the first sidewall 204j are parallel to each other.

In some embodiments, the first conductive type is N-type, and the second conductive type is P-type. In some embodiments, the first trench 204j for forming the N-type first doped region 210j may serve as an N-type trench 204j of the super junction layout unit 620a. Also, the second trench 218j for forming the P-type second doped region 222j may serve as a P-type trench 218j of the super junction layout unit 620a. In the semiconductor device layout structure 600d, the N-type trenches 204j and the P-type trenches 218j of the super junction layout units 620a are arranged alternately.

In some embodiments, the first doped region 210j is formed adjacent to the sidewall of the first trench 204j as shown in FIG. 4A. As shown in FIG. 4A the second doped region 222j is formed adjacent to a sidewall of the second trench 218j. In some embodiments, a plan view shape of the first trench 204j and a plan view shape of the second trench 218j of each of the super junction layout units 620a are the same as each other. For example, plan view shapes of the first trench 204j and the second trench 218j of each of the super junction layout units 620a have a triangular plan view shape.

FIGS. 4B-4E is a plan view showing semiconductor device layout structures 600e-600h of N-type trenches and P-type trenches in accordance with some embodiments of the invention. As shown in FIGS. 4B-4E, the semiconductor device layout structure 600e-600h include a number of super junction layout units 620b-620e arranged in a matrix in accordance with some embodiments. The super junction layout units 620b-620e have layout arrangements similar to the super junction layout unit 620a of the semiconductor device layout structure 600d as shown in FIG. 4A. One of the differences between the super junction layout unit 620a and the super junction layout units 620b-620e is that plan view shapes of the first trenches 204k-204m and the second trenches 218k-218m of the super junction layout units 620b-620e (FIGS. 4B-4E) are different from plan view shapes of the first trench 204j and the second trench 218j of the super junction layout units 620a (FIG. 4A). In some embodiments, the plan view shapes of the first trench and the second trench of each of the super junction layout units includes a circular shape, a triangular shape, a rectangular shape, a hexagonal shape or a polygonal shape.

Figure 4B:
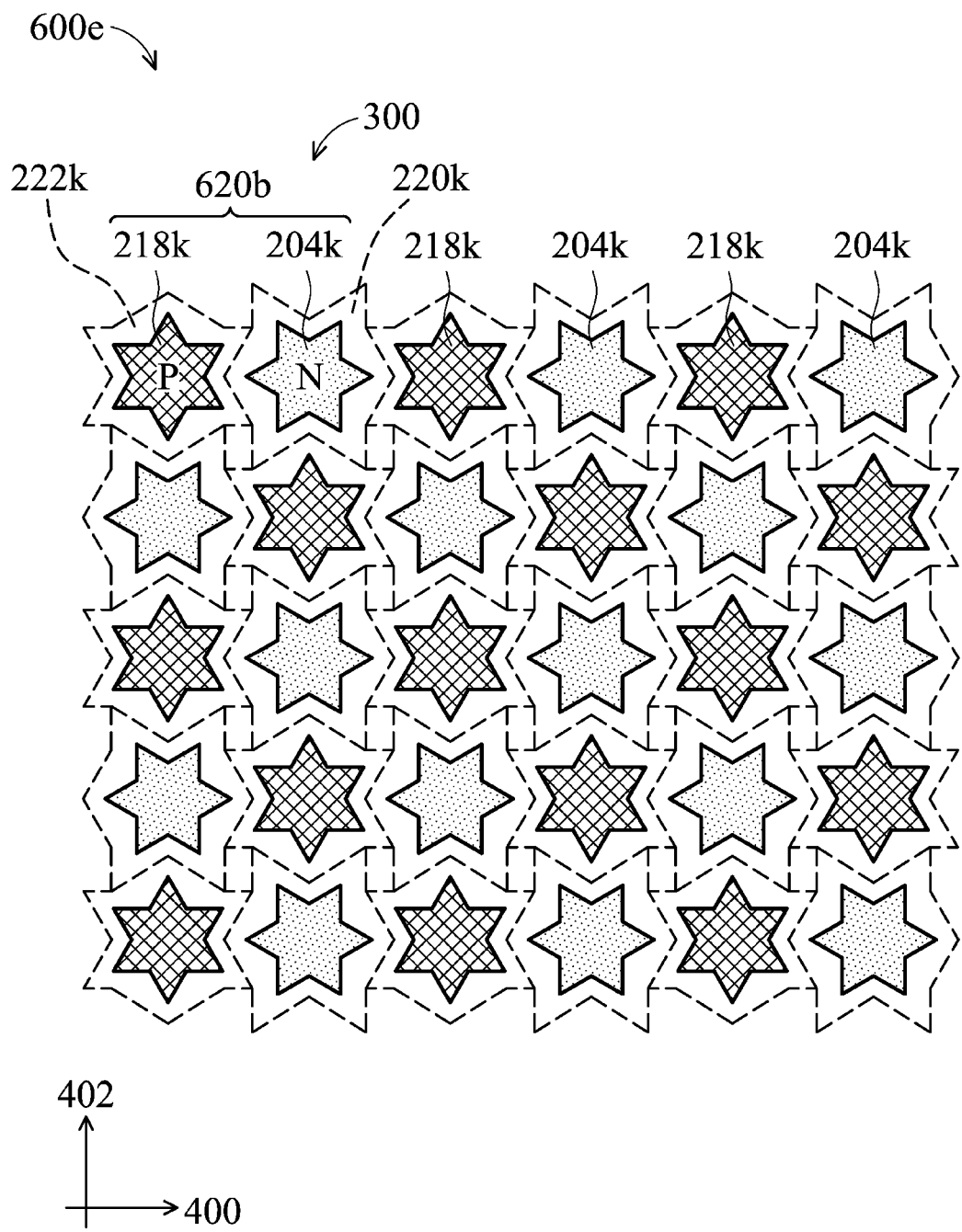

As shown in FIG. 4B, a plan view shape of the first trench 204k and the second trench 218k of the super junction layout unit 620b of the semiconductor device layout structure 600e is a star-like shape in accordance with some embodiments. In some embodiments, the super junction layout unit 620b of the semiconductor device layout structure 600e is composed of one first trench 204k and one second trench 218k. In some embodiments, the first trench 204k for forming an N-type first doped region 220k may serve as an N-type trench 204k of the super junction layout units 620b. Also, the second trench 218k for forming a P-type second doped region 222k may serve as a P-type trench 218k of the super junction layout unit 620b.

Figure 4C:
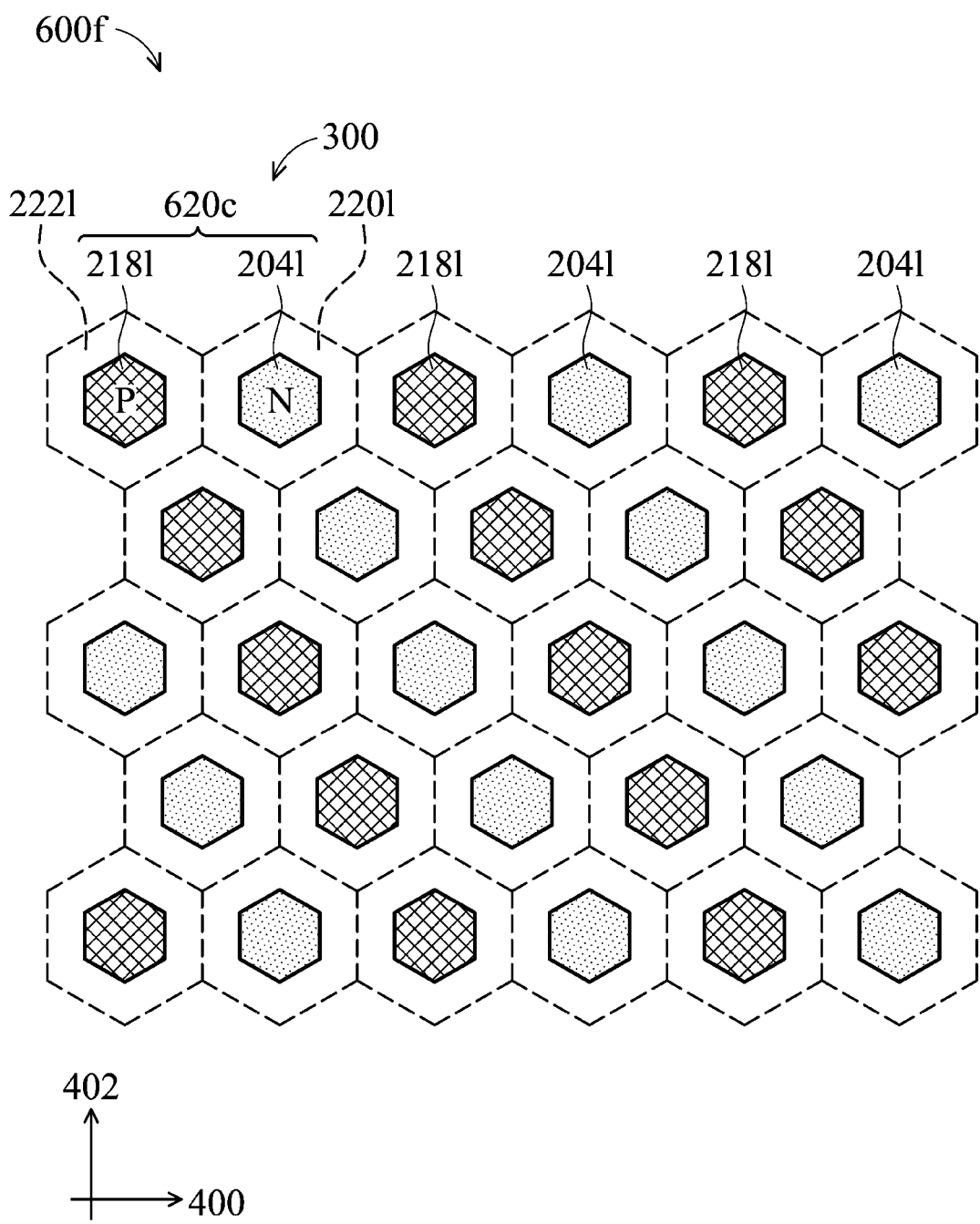
Figure 4D:
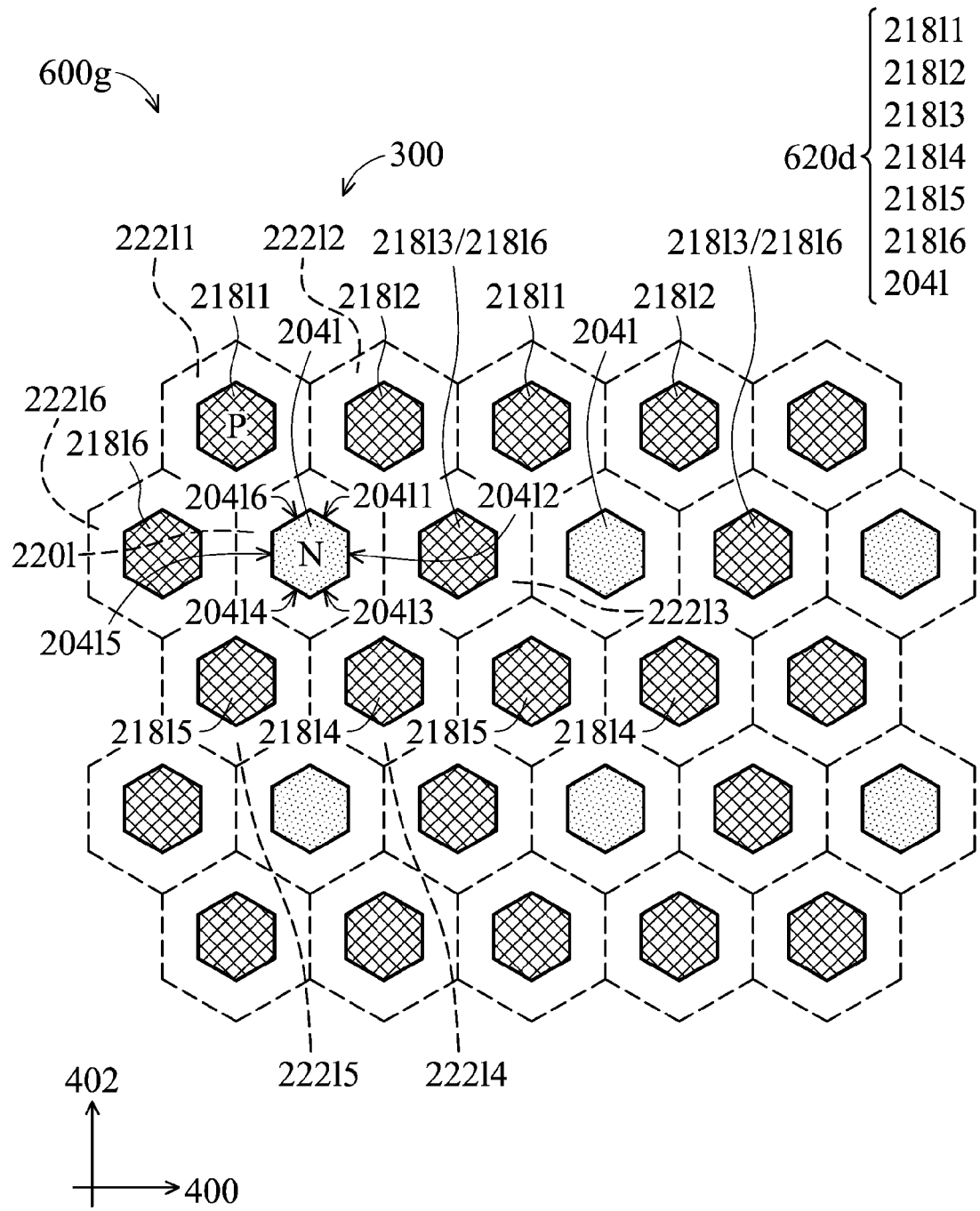

As shown in FIGS. 4C-4D, a plan view shape of the first trenches 204l and the second trenches 218l and 218l1-218l6 of the super junction layout units 620c-620d of the semiconductor device layout structures 600f-600g is a hexagonal shape in accordance with some embodiments. In some embodiments, the super junction layout units 620c and 620d have a different arrangement. As shown in FIG. 4C, the super junction layout units 620c of the semiconductor device layout structure 600f is composed of one first trench 204l and one second trench 218l in accordance with some embodiments. In some embodiments, the first trench 204l for forming an N-type first doped region 220l may serve as an N-type trench 204l of the super junction layout units 620c. Also, the second trench 218l for forming a P-type second doped region 222l may serve as a P-type trench 218l of the super junction layout unit 620c of the semiconductor device layout structures 600f as shown in FIG. 4C. As shown in FIG. 4D, the super junction layout units 620d of the semiconductor device layout structure 600g is composed of one first trench 204l and six second trenches 218l1-218l6 in accordance with some embodiments. The six second trenches 218l1-218l6 are respectively close to six different sidewalls 204/1-204/6. In some embodiments, the first trench 204*l* for forming an N-type first doped region 220*l* may serve as an N-type trench 204*l* of the super junction layout units 620*d*. Also, the second trenches 218/1-218/6 for forming P-type second doped regions 222/1-222/6 may serve as P-type trenches 218/1-218/6 of the super junction layout unit 620*d* of the semiconductor device layout structures 600*g* as shown in FIG. 4D.

Figure 4E:
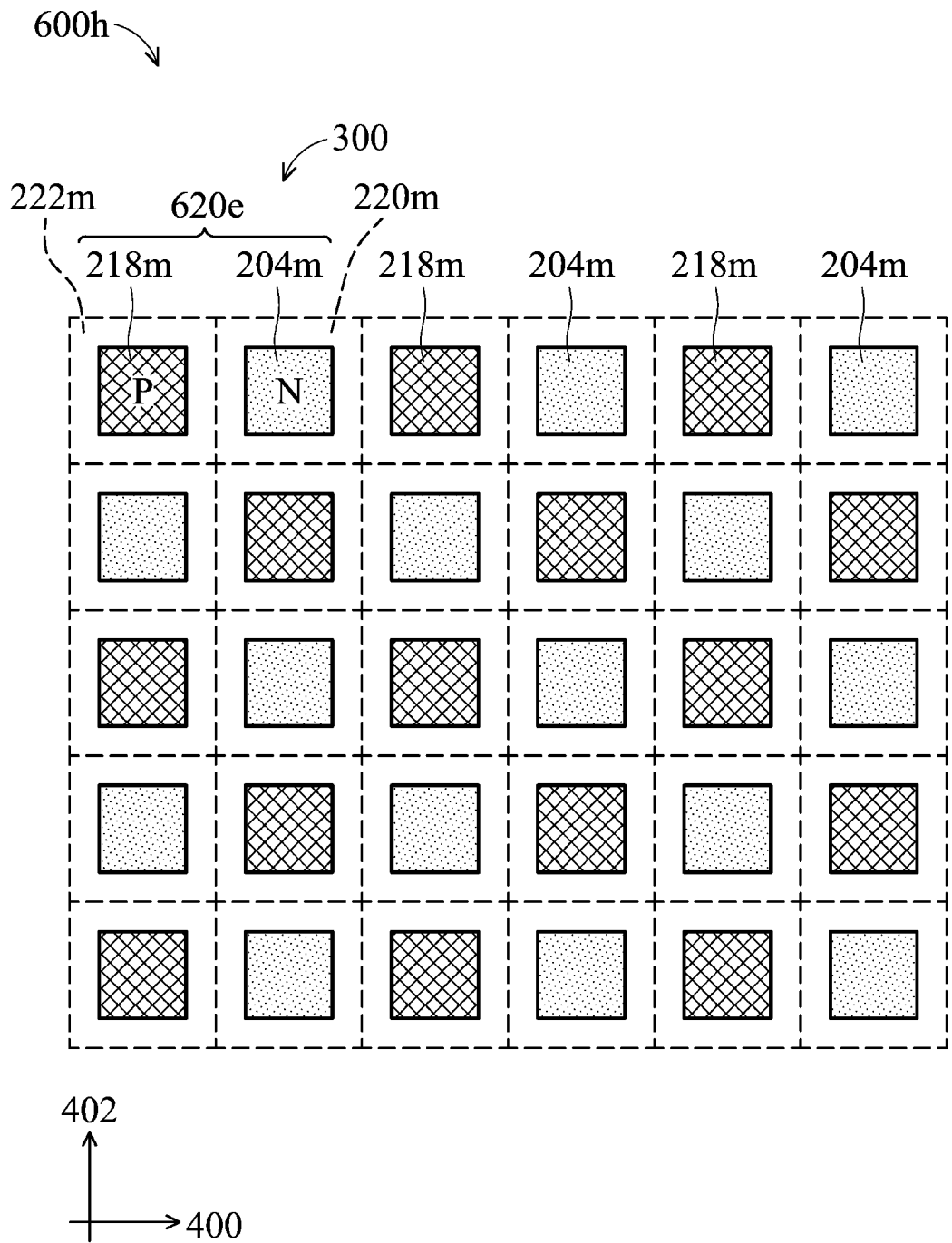

As shown in FIG. 4E, a plan view shape of the first trench 204*m* and the second trench 218*m* of the super junction layout unit 620*e* of the semiconductor device layout structure 600*h* is a rectangular shape in accordance with some embodiments. In some embodiments, the super junction layout unit 620*e* of the semiconductor device layout structure 600*h* is composed of one first trench 204*m* and one second trench 218*m*. In some embodiments, the first trench 204*m* for forming an N-type first doped region 220*m* may serve as an N-type trench 204*m* of the super junction layout units 620*e*. Also, the second trench 218*m* for forming a P-type second doped region 222*m* may serve as a P-type trench 218*m* of the super junction layout unit 620*e* of the semiconductor device layout structures 600*h* as shown in FIG. 4E.

Embodiments of a semiconductor device layout structure are provided. The semiconductor device layout structure includes one super junction layout unit or super junction layout units arranged side-by-side. The super junction layout unit includes an N-type trench and a P-type trench, a N-type first doped region surrounding the N-type trench and the P-type second doped region surrounding the P-type trench adjacent thereto, is arranged in the active region of the epitaxy layer on the semiconductor substrate. In some embodiments, the P-type trench is arranged conformably surrounding a boundary of the N-type trench in a plan view. A plan view shape of the N-type trench may be designed having a rounded terminal to reduce an electric field concentration. In some embodiments, a sidewall portion of the P-type trench away from and surrounding to the boundary of the N-type trench of the super junction layout unit (610*f*) may have a straight boundary (as shown in FIG. 2A) along an arranging direction (the direction 400). In some embodiments, a plurality of P-type trenches is designed surrounding the N-type trench. The P-type trenches are respectively close to different sidewalls of the N-type trench. In some embodiments, the semiconductor device layout structure includes a number of super junction layout units arranged in a matrix. The N-type trenches and P-type trenches of the super junction layout units are alternatively arranged. Embodiments of a semiconductor device layout structure provide a layout design that considers the charge-balance concept to provide a power semiconductor device with a fast switching time while maintaining a breakdown voltage.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device layout structure, comprising:
   an active region having a first conductivity type over a semiconductor substrate, wherein the active region is provided with semiconductor devices formed thereon; and
   a first super junction layout unit in the active region, comprising:
   a first trench;
   a first doped region having a first conductivity type, surrounding the first trench;
   a second trench surrounding the first doped region; and
   a second doped region having a second conductivity type, surrounding the second trench, wherein the first trench is laterally separated from the second trench through the first doped region and the second doped region in a plan view.

2. The semiconductor device layout structure of claim 1, wherein a plan view shape of the first trench comprises a strip-shape extended along a first direction.

3. The semiconductor device layout structure of claim 2, wherein a plan view shape of the second trench comprises a ring-shape extended along the first direction.

4. The semiconductor device layout structure of claim 1, wherein the first doped region is adjacent to a sidewall of the first trench.

5. The semiconductor device layout structure of claim 1, wherein the second doped region is adjacent to a sidewall of the second trench.

6. The semiconductor device layout structure of claim 5, wherein the sidewall of the second trench has an inner sidewall portion close to the first trench and an outer sidewall portion away from the first trench.

7. The semiconductor device layout structure of claim 6, wherein the second doped region adjacent to the inner sidewall portion of the sidewall of the second trench is adjacent to the first doped region.

8. The semiconductor device layout structure of claim 5, wherein the sidewall of the first trench is parallel to the sidewall of the second trench close thereto.

9. The semiconductor device layout structure of claim 6, wherein the first trench has a round-shaped terminal.

10. The semiconductor device layout structure of claim 9, wherein the outer sidewall portion of the second trench close to the round-shaped terminal of the first trench has a round shape.

11. The semiconductor device layout structure of claim 8, wherein the outer sidewall portion of the second trench has a rectangular shape.

12. The semiconductor device layout structure of claim 1, wherein the active region formed in an epitaxy layer on the semiconductor substrate, and the first and second trenches are formed in the epitaxy layer.

13. The semiconductor device layout structure of claim 12, wherein the epitaxy layer further comprises a termination region surrounding the active region.

14. The semiconductor device layout structure of claim 1, wherein there is at least a PN junction on the interface between the first doped region and the second doped region.

15. The semiconductor device layout structure of claim 1, further comprising:
   a second super junction layout unit in the active region, adjacent to the first super junction layout unit, wherein the second super junction layout unit comprises:
   a third trench;
   a third doped region having a first conductivity type, surrounding the third trench;
   a fourth trench surrounding the third doped region; and
   a fourth doped region having a second conductivity type, surrounding the fourth trench, wherein the third trench is laterally separated from the fourth trench through the third doped region and the fourth doped region in a plan view.

16. The semiconductor device layout structure of claim 15, wherein the fourth trench of the second super junction layout unit overlaps with the second trench of the first super junction layout unit.

17. The semiconductor device layout structure of claim 16, wherein a plan view shape of the first and third trenches comprise a strip-shape extended along a first direction.

18. The semiconductor device layout structure of claim 17, wherein the first and third trenches are parallel to each other.

19. The semiconductor device layout structure of claim 17, wherein a portion of the fourth trench of the second super junction layout unit and a portion of the second trench of the first super junction layout unit overlapping with each other are extended along the first direction.

20. The semiconductor device layout structure of claim 17, wherein the first trench has a first length along the first direction and the third trench has a third length along the first direction.

21. The semiconductor device layout structure of claim 20, wherein the third length is different from the first length.

22. The semiconductor device layout structure of claim 20, wherein the third length is equal to the first length.

23. The semiconductor device layout structure of claim 17, wherein the third trench is laterally separated from the fourth trench along a second direction different form the first direction.

24. A semiconductor device layout structure, comprising:
an active region having a first conductivity type over a semiconductor substrate, wherein the active region is provided with semiconductor devices formed thereon; and
a super junction layout unit in the active region, comprising:
a first trench having a first sidewall and a second sidewall adjacent to the first sidewall;
a first doped region having a first conductivity type, surrounding the first trench;
a second trench close to the first sidewall of the first trench;
a second doped region having a second conductivity type, surrounding the second trench, wherein the first trench is laterally separated from the second trench through the first doped region and the second doped region in a plan view;
a third trench close to the second sidewall of the first trench; and
a third doped region having the second conductivity type, surrounding the second trench, wherein the first trench is laterally separated from the third trench through the first doped region and the third doped region in a plan view.

25. The semiconductor device layout structure of claim 24, wherein a first distance between the first trench and the second trench is equal to a second distance between the first trench and the third trench.

26. The semiconductor device layout structure of claim 24, wherein a plan view shape of the first and second trenches comprises a strip-shape along a first direction.

27. The semiconductor device layout structure of claim 26, wherein the first sidewall is along the first direction, the second sidewall is along a second direction different form the first direction.

28. The semiconductor device layout structure of claim 27, wherein the third trench is aligned with the second trench along the second direction.

29. The semiconductor device layout structure of claim 24, wherein the first doped region is adjacent to the first and second sidewalls of the first trench, the second doped region is adjacent to a sidewall of the second trench, and the third doped region is adjacent to a sidewall of the third trench.

30. The semiconductor device layout structure of claim 27, wherein the first doped region is adjacent to the second doped region along the second direction.

31. The semiconductor device layout structure of claim 27, wherein the third doped region is adjacent to the first doped region along the first direction.

32. The semiconductor device layout structure of claim 27, wherein a width of the third trench is equal to a width of the first trench along the second direction.

33. The semiconductor device layout structure of claim 24, wherein the active region formed in an epitaxy layer on the semiconductor substrate, and the first, second and third trenches are formed in the epitaxy layer.

34. The semiconductor device layout structure of claim 33, wherein the epitaxy layer further comprises a termination region surrounding the active region.

35. A semiconductor device layout structure, comprising:
an active region having a first conductivity type over a semiconductor substrate, wherein the active region is provided with semiconductor devices formed thereon; and
a super junction layout unit in the active region, comprising:
a first trench;
a first doped region having a first conductivity type, surrounding the first trench;
a second trench close to the first trench;
a second doped region having a second conductivity type, surrounding the second trench, wherein the first trench is laterally separated from the second trench through the first doped region and the second doped region in a plan view, and wherein a first sidewall of the first trench and a second sidewall of the second trench close to the first sidewall are parallel to each other.

36. The semiconductor device layout structure of claim 35, further comprising a plurality of super junction layout units arranged in a matrix, wherein the first and second trenches are arranged alternately.

37. The semiconductor device layout structure of claim 35, wherein a plan view shape of the first trench and a plan view shape of the second trench of the super junction layout unit are the same as each other.

38. The semiconductor device layout structure of claim 35, wherein a plan view shape of the first and the second trenches comprises a circular shape, a triangular shape, a rectangular shape, a hexagonal shape or a polygonal shape.

39. The semiconductor device layout structure of claim 35, wherein the active region is formed in an epitaxy layer on the semiconductor substrate, and the first and second trenches are formed in the epitaxy layer.

40. The semiconductor device layout structure of claim 39, wherein the epitaxy layer further comprises a termination region surrounding the active region.

* * * * *